US011283439B2

(12) United States Patent
Miyazawa

(10) Patent No.: US 11,283,439 B2
(45) Date of Patent: Mar. 22, 2022

(54) SEMICONDUCTOR DEVICE

(71) Applicant: FUJI ELECTRIC CO., LTD., Kawasaki (JP)

(72) Inventor: Shigemi Miyazawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/835,098

(22) Filed: Mar. 30, 2020

(65) Prior Publication Data

US 2020/0366280 A1 Nov. 19, 2020

(30) Foreign Application Priority Data

May 15, 2019 (JP) ............................ JP2019-091818

(51) Int. Cl.
*H03K 17/06* (2006.01)
*H03K 17/082* (2006.01)

(52) U.S. Cl.
CPC ......... *H03K 17/0828* (2013.01); *H03K 17/06* (2013.01); *H03K 2017/066* (2013.01)

(58) Field of Classification Search
CPC ............... H03K 17/0828; H03K 17/06; H03K 2017/066; H03K 17/063
See application file for complete search history.

(56) References Cited

U.S. PATENT DOCUMENTS 4,074,294 A * 2/1978 Fujita .................... G03B 17/24 396/317
2009/0289670 A1 11/2009 Toyoda et al.
2014/0368255 A1* 12/2014 Hayasaka ........... H03K 17/063 327/427
2018/0017033 A1* 1/2018 Miyazawa ........... H03K 17/042

FOREIGN PATENT DOCUMENTS

JP 2009284420 A 12/2009

* cited by examiner

*Primary Examiner* — Patrick C Chen
(74) *Attorney, Agent, or Firm* — Rabin & Berdo, P.C.

(57) ABSTRACT

A semiconductor device includes a power semiconductor chip, a threshold setting unit and a breaker circuit. The power semiconductor chip is connected between an output terminal and an earth terminal, and is configured to be turned on or off according to a potential at a gate terminal thereof. The threshold setting unit outputs an interrupt signal upon detecting that a voltage of a control signal received at an input terminal is lower than a predetermined voltage. The breaker circuit is connected between the gate terminal and the earth terminal, and switches on upon receiving the interrupt signal to thereby turn off the power semiconductor chip. The threshold setting unit includes a feed circuit that is configured to supply an electric charge stored in gate capacitance of the power semiconductor chip to the threshold setting unit responsive to a sudden drop of the voltage of the control signal.

10 Claims, 9 Drawing Sheets

SEMICONDUCTOR DEVICE

CROSS-REFERENCE TO RELATED APPLICATION

This application is based upon and claims the benefit of priority of the prior Japanese Patent Application No. 2019-091818, filed on May 15, 2019, the entire contents of which are incorporated herein by reference.

BACKGROUND OF THE INVENTION

1. Field of the Invention

The embodiments discussed herein relate to a semiconductor device.

2. Background of the Related Art

In ignition systems used on automobile internal-combustion engines, semiconductor devices are adopted as igniters for controlling energization and de-energization of ignition coils. Well-known semiconductor devices used for this purpose often include a power semiconductor chip capable of handling large amounts of power and an integrated circuit having a function of ensuring reliable switching of the power semiconductor chip (see, for example, Japanese Laid-open Patent Publication No. 2009-284420 (paragraphs [0002] to [0005] and FIG. 6)). A conventional semiconductor device is explained below.

FIG. 8 is a circuit diagram illustrating a configuration example of an ignition system using a conventional semiconductor device. FIGS. 9A and 9B are timing diagrams, each illustrating an example of how the ignition system using the conventional semiconductor device operates, with FIG. 9A being associated with an example of normal operation and FIG. 9B being associated with an example of operation with the presence of noise.

An ignition system used on an automobile internal-combustion engine includes a semiconductor device 100, an ignition coil 110, a spark plug 120, a battery 130, and an engine control unit (ECU) 140. The semiconductor device 100 includes an input terminal 101 for receiving a control signal Vin from the ECU 140, an output terminal 102 connected to one terminal of a primary coil 111 in the ignition coil 110, and an earth terminal 103 connected to the negative terminal of the battery 130. The other terminal of the primary coil 111 in the ignition coil 110 is connected to the positive terminal of the battery 130. One terminal of a secondary coil 112 in the ignition coil 110 is connected to one electrode of the spark plug 120, the other electrode of which is grounded. The other terminal of the secondary coil 112 in the ignition coil 110 is connected to the positive terminal of the battery 130. Note that the negative terminal of the battery 130 provides a reference potential of the ignition system.

The semiconductor device 100 includes a power semiconductor chip 104, a resistor 105, a threshold setting unit 106, and a metal-oxide-semiconductor field-effect transistor (MOSFET) 107. In this example, an insulated gate bipolar transistor (IGBT) is used as the power semiconductor chip 104. As for the power semiconductor chip 104, its collector terminal is connected to the output terminal 102 of the semiconductor device 100 while its emitter terminal is connected to the earth terminal 103 of the semiconductor device 100. The gate terminal of the power semiconductor chip 104 is connected to one terminal of the resistor 105, the other terminal of which is connected to the input terminal 101 of the semiconductor device 100.

The threshold setting unit 106 includes a resistor **106*a*, a capacitor 106*b*, and an interrupt signal generating unit 106*c*. One terminal of the resistor 106*a* is connected to the input terminal 101 of the semiconductor device 100. The other terminal of the resistor 106*a* is connected to one terminal of the capacitor 106*b*, the other terminal of which is connected to the earth terminal 103 of the semiconductor device 100. The resistor 106*a* and the capacitor 106*b* form a low-pass filter, and connection terminals of the resistor 106*a* and the capacitor 106*b* are connected to a supply terminal of the interrupt signal generating unit 106*c*. As for the interrupt signal generating unit 106*c*, its output terminal is connected to the gate terminal of the MOSFET 107 and its earth terminal is connected to the earth terminal 103 of the semiconductor device 100. As for the MOSFET 107, its drain terminal is connected to the gate terminal of the power semiconductor chip 104 while its source terminal is connected to the earth terminal 103 of the semiconductor device 100**.

Next described are operations of the ignition system performed in response to a control signal Vin output from the ECU 140, with reference to the timing diagram of FIG. 9A. Note that FIG. 9A depicts, from the top to the bottom, changes in the control signal Vin; a voltage signal Vs which supplies power to the interrupt signal generating unit **106*c*; a gate voltage Vg and a collector current Ic of the power semiconductor chip 104; and a voltage Vp of the spark plug 120**.

First, when the control signal Vin being output is an OFF signal set at the reference potential, the gate voltage Vg applied to the gate terminal of the power semiconductor chip 104 is also OFF. Therefore, the power semiconductor chip 104 is in OFF-state. At this time, no collector current Ic of the power semiconductor chip 104 is flowing, and the voltage Vp of the spark plug 120 is held at the voltage of the battery 130.

At time t0 when the input terminal 101 of the semiconductor device 100 receives the control signal Vin being ON, the ON signal is input first to the threshold setting unit 106 as a power-supply voltage for the threshold setting unit 106. In the threshold setting unit 106, the control signal Vin is routed through the low-pass filter made up of the resistor **106*a* and the capacitor 106*b* to thereby obtain the voltage signal Vs of the interrupt signal generating unit 106*c*. Until the voltage signal Vs increases to reach a predetermined threshold Vthin, the interrupt signal generating unit 106*c* outputs an interrupt signal being ON to put the MOSFET 107 in ON-state, to thereby clamp the gate voltage Vg of the power semiconductor chip 104** to the reference potential level.

At time t1 when the voltage signal Vs reaches the predetermined threshold Vthin, the MOSFET 107 switches off. At this time, the gate voltage Vg of the power semiconductor chip 104 has gone higher than a threshold voltage level at which the power semiconductor chip 104 turns on. Therefore, the power semiconductor chip 104 is turned on at the same time when the MOSFET 107 switches off.

Once the power semiconductor chip 104 is turned on, electric current starts to flow in the primary coil 111 of the ignition coil 110. Therefore, the collector current Ic of the power semiconductor chip 104 gradually increases. Once the collector current Ic of the power semiconductor chip 104 saturates at time t2, the collector current Ic then maintains its value constant.

Once the control signal Vin changes to off at time t3, the interrupt signal generating unit 106*c* of the threshold setting unit 106 determines a drop in the control signal Vin. That is, when the voltage signal Vs decreases to the predetermined threshold Vthin, the interrupt signal generating unit 106*c* outputs the interrupt signal being ON to put the MOSFET 107 in ON-state to thereby pull the gate voltage Vg of the power semiconductor chip 104 down to the reference potential level. Herewith, the power semiconductor chip 104 is turned off, which cuts off the collector current Ic. The cutoff of the current flowing in the primary coil 111 of the ignition coil 110 causes a change in the magnetic field. A voltage is produced in the primary coil 111 due to self-induction, and then a high voltage is produced in the secondary coil 112 due to mutual induction. The high voltage is supplied to the spark plug 120, and the voltage Vp causes discharge across the gap of the spark plug 120 to produce a spark.

In automobiles, a predetermined number of semiconductor devices 100 used as igniters is arranged in accordance with the number of cylinders of the internal-combustion engine, and electrical noise is generated when the individual semiconductor devices 100 produce a spark. In addition, automobiles are equipped with a large number of electric components, which are also noise generation sources. Especially, high noise immunity is needed for the semiconductor devices 100 because if the semiconductor devices 100 malfunctions due to noise, they may not only be unable to provide proper ignition timing but may also damage the internal-combustion engine.

FIG. 9B illustrates a case in which, when the power semiconductor chip 104 is in ON-state, the control signal Vin experiences a sudden large drop at time t2*a* due to the influence of large external noise in a negative direction (a negative surge voltage). In such a case, the voltage signal Vs supplied to the interrupt signal generating unit 106*c* also decreases and, in some instances, may fall below the threshold Vthin, which causes the interrupt signal generating unit 106*c* to output an interrupt signal. The interrupt signal output from the interrupt signal generating unit 106*c* switches the MOSFET 107 on, which forces the gate voltage Vg of the power semiconductor chip 104 to drop for a moment. Especially, if the noise lasts long, the gate voltage Vg is brought down all the way to the reference potential level. In this case, the semiconductor device 100 malfunctions, turning off the power semiconductor chip 104 despite receiving the control signal Vin to put the power semiconductor chip 104 in ON-state. Even if the gate voltage Vg does not decrease to the level that turns off the power semiconductor chip 104, the decrease in the gate voltage Vg causes a rapid drop in the collector current Ic, which may cause a negative voltage Vp across the secondary coil 112 of the ignition coil 110. If the voltage Vp exceeds a discharge voltage, a spark discharge occurs at unintended timing.

Increasing the time constant of the low-pass filter of the threshold setting unit 106 may be adopted as a means of preventing such malfunction. Herewith, the resistor 106*a* or the capacitor 106*b* controls a decrease in the voltage signal Vs despite a sudden drop in the control signal Vin due to the influence of external noise, thereby preventing malfunction such as erroneous ignition.

Boosting noise immunity needs to increase the time constant of the low-pass filter; however, implementation of a capacitor with large capacitance on an integrated circuit involves increased chip size, thus resulting in an increase in costs.

SUMMARY OF THE INVENTION

According to one embodiment, there is provided a semiconductor device having an input terminal, an output terminal and an earth terminal. The semiconductor device includes: a power semiconductor chip having a gate terminal, the power semiconductor chip being connected between the output terminal and the earth terminal, and being configured to be turned on or off according to a potential at the gate terminal; a threshold setting unit including a feed circuit, the threshold setting unit being configured to use a control signal received at the input terminal as an operation power supply, and to output an interrupt signal upon detecting that a voltage of the control signal is lower than a predetermined voltage; and a breaker circuit connected between the gate terminal of the power semiconductor chip and the earth terminal, and configured to switch on upon receiving the interrupt signal to thereby turn off the power semiconductor chip, wherein the feed circuit uses, as an auxiliary power supply, an electric charge stored in gate capacitance of the power semiconductor chip, to supply the stored electric charge to the threshold setting unit responsive to a sudden drop of the voltage of the control signal.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
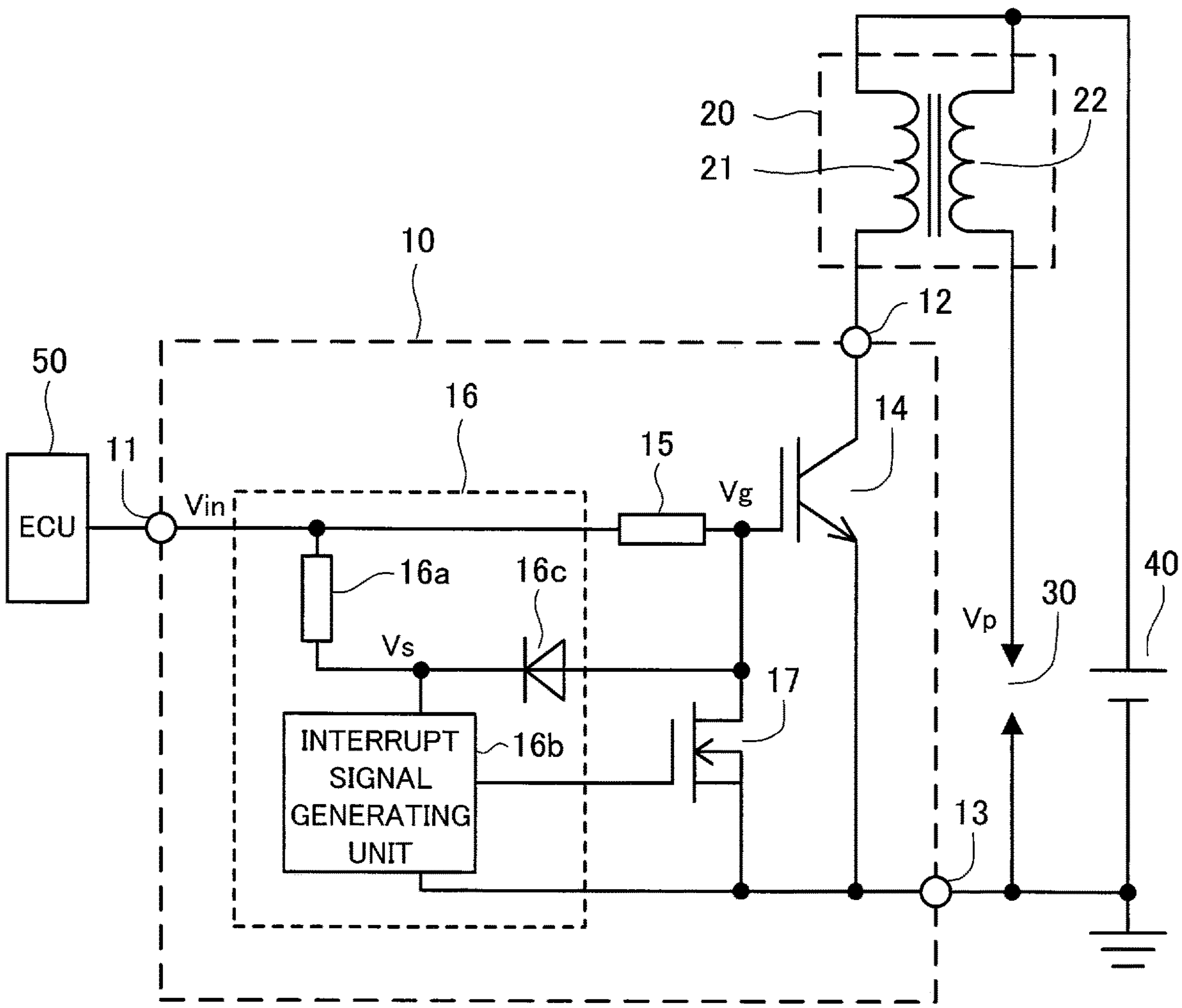
FIG. 1 is a circuit diagram illustrating a configuration example of an ignition system using a semiconductor device according to a first embodiment.

Several embodiments being applied to an igniter used for ignition systems of automobile internal-combustion engines will be described below in detail with reference to the accompanying drawings, wherein like reference numerals refer to like elements throughout. Note that two or more of the embodiments below may be partially combined for implementation in such a way that no contradiction arises.

Figure 3:
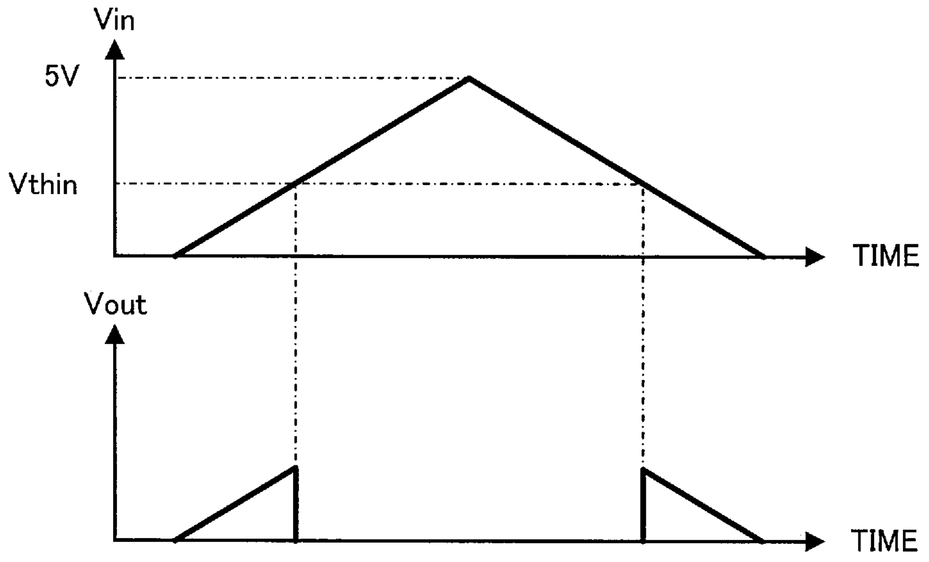
FIG. 3 illustrates input-output characteristics of the interrupt signal generating unit.
Figure 4A:
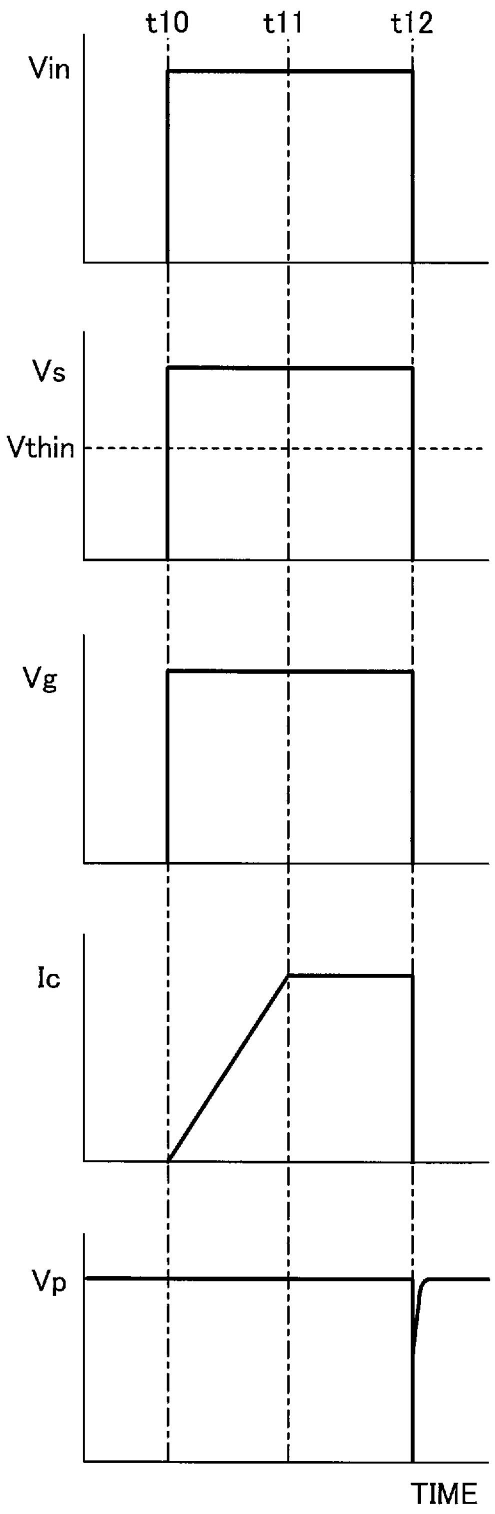
FIGS. 4A and 4B are timing diagrams, each illustrating an example of how the ignition system using the semiconductor device according to the first embodiment operates, with FIG. 4A being associated with an example of normal operation and FIG. 4B being associated with an example of operation with the presence of noise.
Figure 4B:
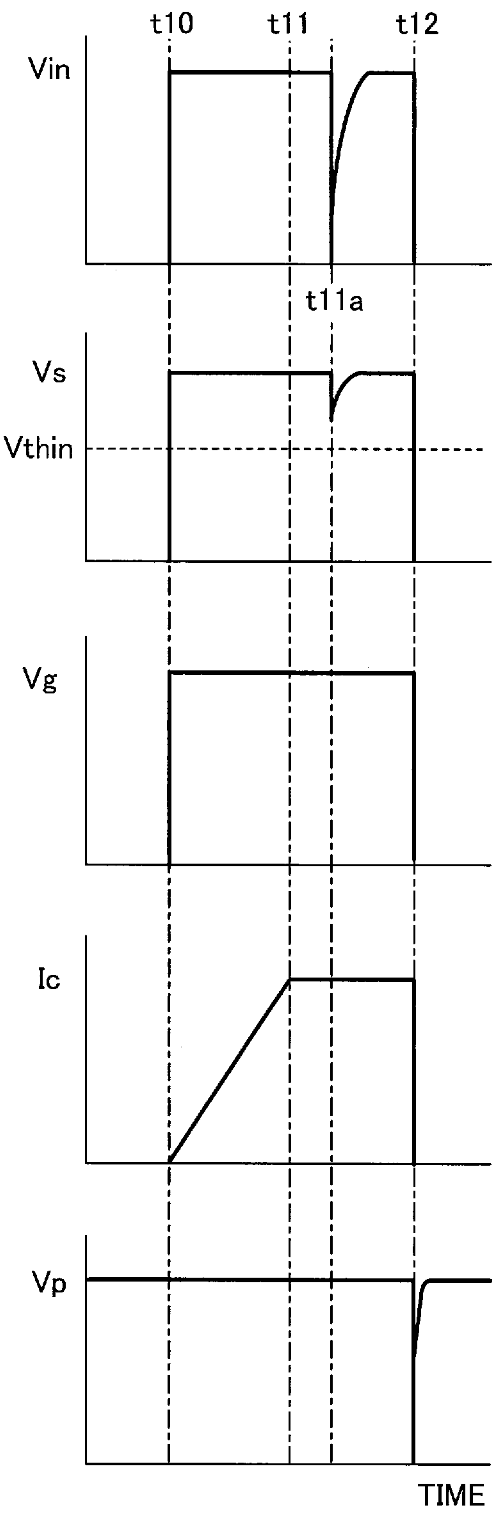

FIG. 1 is a circuit diagram illustrating a configuration example of an ignition system using a semiconductor device according to a first embodiment. FIG. is a circuit diagram illustrating a configuration example of an interrupt signal generating unit. FIG. 3 illustrates input-output characteristics of the interrupt signal generating unit. FIGS. 4A and 4B are timing diagrams, each illustrating an example of how the ignition system using the semiconductor device according to the first embodiment operates, with FIG. 4A being associated with an example of normal operation and FIG. 4B being associated with an example of operation with the presence of noise.

The ignition system illustrated in FIG. 1 includes a semiconductor device 10, an ignition coil 20, a spark plug 30, a battery 40, and an engine control unit (ECU) 50. The semiconductor device 10 includes an input terminal 11 for receiving a control signal Vin from the ECU 50, an output terminal 12 connected to one terminal of a primary coil 21 in the ignition coil 20, and an earth terminal 13 connected to the negative terminal of the battery 40. The other terminal of the primary coil 21 is connected to the positive terminal of the battery 40, and the negative terminal of the battery 40 is connected to a chassis of an automobile, providing a reference potential of the ignition system. A secondary coil 22 in the ignition coil 20 has a terminal connected to a center electrode of the spark plug 30, whose earth electrode is connected to the negative terminal of the battery 40. The other terminal of the secondary coil 22 in the ignition coil 20 is connected to the positive terminal of the battery 40.

The semiconductor device 10 includes a power semiconductor chip 14, a resistor (gate resistor) 15, a threshold setting unit 16, and a MOSFET (breaker circuit) 17. Note that the resistor 15, the threshold setting unit 16, and the MOSFET 17 are assembled into an integrated circuit.

An IGBT is used here for the power semiconductor chip 14 and has a high voltage resistance, for example, up to hundreds of volts (V). The power semiconductor chip 14 is a vertical device, for example, with its collector electrode formed on a first surface of a substrate and its gate electrode and emitter electrode formed on a second surface opposite to the first surface. Note that, in place of the IGBT, a different voltage-controlled power semiconductor chip, such as a power MOSFET having a vertical structure, may be used as the power semiconductor chip 14.

As for the power semiconductor chip 14, its collector terminal and emitter terminal are connected to the output terminal 12 and the earth terminal 13, respectively, of the semiconductor device 10. The gate terminal of the power semiconductor chip 14 is connected to one terminal of the resistor 15, the other terminal of which is connected to the input terminal 11 of the semiconductor device 10. The resistor 15 serves as a potential difference generating unit for causing a potential difference between a gate voltage Vg and the control signal Vin across the gate terminal of the power semiconductor chip 14 and the input terminal 11 of the semiconductor device 10. The potential difference generating unit served by the resistor 15 preferably has a resistance of about 1 to 10 kiloohms (kW.

The threshold setting unit 16 includes a resistor 16*a* for reducing the voltage of the control signal Vin, an interrupt signal generating unit 16*b* for generating an interrupt signal, and a diode 16*c* realizing a feed circuit. As for the resistor 16*a*, one terminal is connected to the input terminal 11 of the semiconductor device 10, and its other terminal is connected to a supply terminal of the interrupt signal generating unit 16*b*. As for the interrupt signal generating unit 16*b*, its output terminal is connected to the gate terminal of the re-channel MOSFET 17, and its earth terminal is connected to the earth terminal 13 of the semiconductor device 10. As for the MOSFET 17, its drain terminal is connected to the gate terminal of the power semiconductor chip 14, and its source terminal is connected to the earth terminal 13 of the semiconductor device 10. As for the diode 16*c*, its anode terminal is connected to the gate terminal of the power semiconductor chip 14, and its cathode terminal is connected to the supply terminal of the interrupt signal generating unit 16*b*. The diode 16*c* suffices as long as it is capable of supplying current in the order of microamperes (μA).

Figure 2:
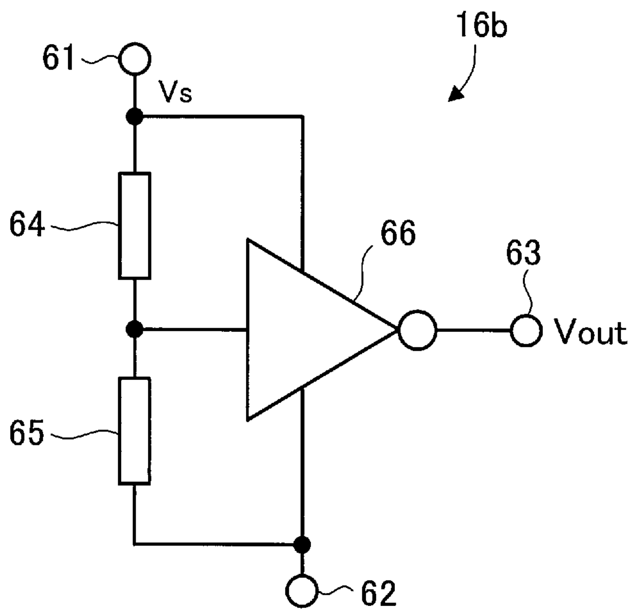
FIG. 2 is a circuit diagram illustrating a configuration example of an interrupt signal generating unit.

The interrupt signal generating unit 16*b* includes a supply terminal 61, an earth terminal 62, an output terminal 63, resistors 64 and 65 forming a voltage dividing circuit, and an inverter 66, as illustrated in FIG. 2. The supply terminal 61 is connected to the other terminal of the resistor 16*a* and the cathode terminal of the diode 16*c*. The earth terminal 62 is connected to the earth terminal 13 of the semiconductor device 10. The output terminal 63 is connected to the gate terminal of the MOSFET 17.

In the interrupt signal generating unit 16*b*, the supply terminal 61 is connected to one terminal of the resistor 64 and the supply terminal of the inverter 66. The other terminal of the resistor 64 is connected to one terminal of the resistor 65 and the input terminal of the inverter 66. The other terminal of the resistor 65 is connected to the earth terminal 62 of the interrupt signal generating unit 16*b* and the earth terminal of the inverter 66. The output terminal of the inverter 66 is connected to the output terminal 63 of the interrupt signal generating unit 16*b*. The inverter 66 receives, as its operation power supply, a voltage signal Vs obtained by dividing the voltage of the control signal Vin by the resistor 16*a* and a series circuit formed of the resistors 64 and 65. Note that the resistance of the resistor 16*a* is set to a value such that a voltage drop (Vin−Vs) across the resistor 16*a* determined by the ratio between the resistor 16*a* and the series circuit formed of the resistors 64 and 65 becomes lower than a forward voltage of the diode 16*c*.

The interrupt signal generating unit 16*b* has the input-output characteristics depicted in FIG. 3. That is, the interrupt signal generating unit 16*b* receives, as its operation power supply, the voltage signal Vs produced by reducing the voltage of the control signal Vin. For this reason, during a transient rise of the control signal Vin, the interrupt signal generating unit 16*b* outputs an output voltage Vout having almost the same potential as the control signal Vin until a voltage obtained by dividing the voltage of the voltage signal Vs by the voltage dividing circuit formed of the resistors 64 and 65 reaches a threshold Vthin of the inverter 66. The output voltage Vout acts as an interrupt signal, and when it exceeds a threshold of the MOSFET 17, the MOSFET 17 is put in ON-state, which forces the gate voltage Vg of the power semiconductor chip 14 close to ground potential. Herewith, the power semiconductor chip 14 is not turned on, and remains turned off despite receiving the control signal Vin being ON.

If, during the transient rise of the control signal Vin, the voltage obtained by dividing the voltage of the voltage signal Vs by the resistors 64 and 65 exceeds the threshold Vthin for turning off the inverter 66, the inverter 66 outputs a low potential to put the MOSFET 17 in OFF-state. At this moment in time, the control signal Vin is applied to the gate terminal of the power semiconductor chip 14 via the resistor 15, which then turns on the power semiconductor chip 14 to be conductive.

Next, if an input voltage of the inverter 66 falls below the threshold Vthin when the control signal Vin is falling, the inverter 66 outputs a high potential to put the MOSFET 17 in ON-state. At this moment in time, the gate voltage Vg of the power semiconductor chip 14 drops, which then turns off the power semiconductor chip 14 to be non-conductive.

Subsequently, the output voltage Vout of the inverter 66 decreases in accordance with the voltage of the control signal Vin. Then, when the output voltage Vout falls below the threshold of the MOSFET 17, the MOSFET 17 is switched off.

As described above, the threshold setting unit uses the threshold Vthin of the inverter 66, having small variations in characteristics associated with the timing of turning on and off the power semiconductor chip 14, rather than a threshold of the power semiconductor chip 14, having large variations in the characteristics. Note that the graphs in FIG. 3 are depicted with enlarged time axes to facilitate understanding of transient changes of the control signal Vin and the output voltage Vout.

Next described are operations of the ignition system equipped with the semiconductor device 10 having the above-described configuration, with reference to FIGS. 4A and 4B. In FIGS. 4A and 4B, each horizontal axis represents time while each vertical axis represents voltage or current. Note that FIGS. 4A and 4B depict, from the top to the bottom, changes in the control signal Vin; the voltage signal Vs; the gate voltage Vg and the collector current Ic of the power semiconductor chip 14; and a voltage Vp of the spark plug 30.

First, in normal operation, at time t10 when the control signal Vin received from the ECU 50 rises from low (0 V) to high (for example, 5V), the voltage signal Vs of the threshold setting unit 16 also rises in like fashion, as illustrated in FIG. 4A. When the voltage generated by dividing the voltage of the voltage signal Vs exceeds the threshold Vthin of the inverter 66, the MOSFET 17 serving as a breaker circuit is switched off. Herewith, the gate voltage Vg of the power semiconductor chip 14 rises, and the capacitance between the gate and the emitter (gate capacitance) of the power semiconductor chip 14 is charged, which then turns on the power semiconductor chip 14.

Herewith, the collector current Ic starts to flow in the power semiconductor chip 14 from the battery 40 via the primary coil 21 of the ignition coil 20. Note that temporal change dl/dt of the collector current Ic is determined according to inductance of the primary coil 21 and a supply voltage of the battery 40, and the collector current Ic increases until time t11 at which it reaches a predetermined current value. Subsequently, the collector current Ic is maintained constant.

At time t12 when the control signal Vin falls from high to low, the power semiconductor chip 14 is turned off, and the collector current Ic rapidly decreases. The rapid decrease of the collector current Ic produces a self-induced electromagnetic field (EMF), which rapidly increases the voltage across the primary coil 21. This then generates an induced EMF of up to about tens of kilovolts (kV) across the secondary coil 22. This voltage Vp of the secondary coil 22 is supplied to the spark plug 30 to produce a spark across the gap of the spark plug 30.

Thus, in the case where the voltage of the control signal Vin takes no sudden drop when the control signal Vin is exercising turn-on control of the power semiconductor chip 14, a potential difference exceeding the forward voltage of the diode 16*c* does not exist between the gate voltage Vg and the voltage signal Vs. As a result, the diode 16*c* serves no function.

Next described is a case in which the control signal Vin drops suddenly (for several microseconds (μs), for example) due to the influence of a negative surge voltage at time t11*a* when the power semiconductor chip 14 is in ON-state, as illustrated in FIG. 4B.

If a negative surge voltage is applied to the input terminal 11 at time t11*a*, the negative surge voltage decays through the resistor 16*a* to the voltage signal Vs, which is then input to the interrupt signal generating unit 16*b*. At this time, even if the voltage signal Vs is set to decay so as to attenuate the negative surge voltage, if the voltage input to the inverter 66 of the interrupt signal generating unit 16*b* falls below the threshold Vthin of the inverter 66, the MOSFET 17 is switched on. This causes a rapid drop of the gate voltage Vg.

If the collector current Ic immediately before the application of the negative surge voltage is Ic>½×gm×(Vga−Vthi), the collector current Ic rapidly decreases due to the negative surge voltage. Note here that Vga is the gate voltage of the power semiconductor chip 14 immediately after the surge voltage is generated, Vthi is the threshold of the power semiconductor chip 14, and gm is the transconductance of the power semiconductor chip 14.

As described above, it is understood that, even if the control signal Vin satisfies the conducting condition of the power semiconductor chip 14, the power semiconductor chip 14 may rapidly decrease the collector current Ic due to a negative surge voltage. If this is the case, the spark plug 30 erroneously fires early at time t11*a* although it is not supposed to fire before time t12.

According to the semiconductor device 10, however, during the control signal Vin being at a high potential, the voltage signal Vs does not fall below the threshold Vthin of the inverter 66 even if the control signal Vin takes a sudden drop due to a negative surge voltage. That is, if the control signal Vin takes a sudden drop, which is then accompanied by the potential difference between the control signal Vin and the voltage signal Vs exceeding the forward voltage of the diode 16*c*, the diode 16*c* is turned on. Herewith, the diode 16*c* starts supplying an electric charge stored in the gate capacitance of the power semiconductor chip 14 to the supply terminal 61 of the interrupt signal generating unit 16*b*. Thus, the diode 16*c* uses the electric charge of the gate capacitance as emergency auxiliary power supply when the control signal Vin has taken a sudden drop to thereby supply electric charge to the supply terminal 61 of the interrupt signal generating unit 16*b*, which controls a decrease in the voltage signal Vs. As a result, it is possible to prevent malfunction of the threshold setting unit 16 and erroneous ignition of the spark plug 30 due to a negative surge voltage.

Figure 5:
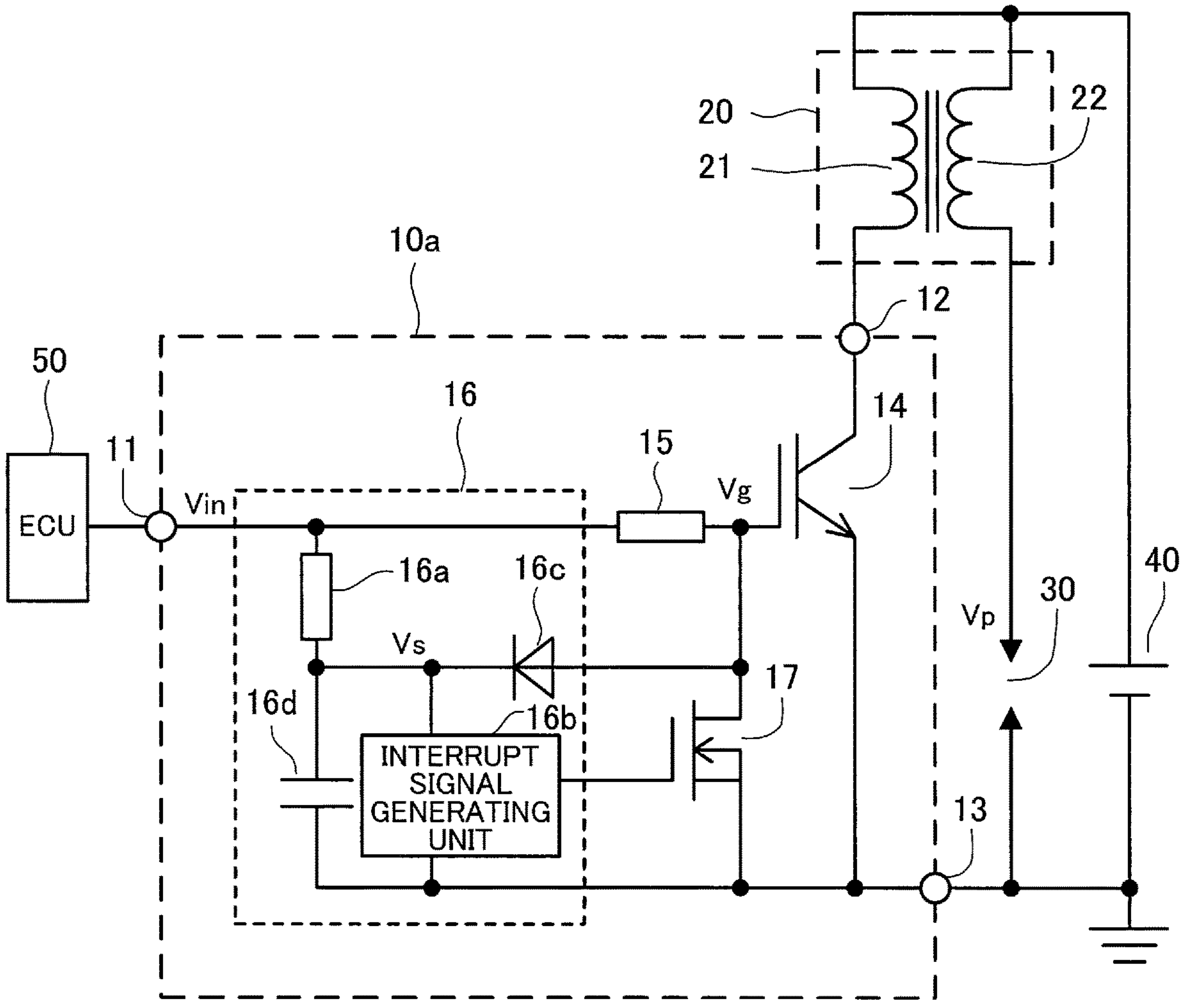
FIG. 5 is a circuit diagram illustrating a configuration example of an ignition system using a semiconductor device according to a second embodiment.

FIG. 5 is a circuit diagram illustrating a configuration example of an ignition system using a semiconductor device according to a second embodiment. In FIG. 5, the same reference numerals are given to the same or corresponding components as those illustrated in FIG. 1, and the detailed description thereof will be omitted.

According to a semiconductor device 10*a* of the second embodiment, a capacitor 16*d* is connected to the supply terminal and the earth terminal of the interrupt signal generating unit 16*b*. Herewith, the resistor 16*a* and the capacitor 16*d* forms a low-pass filter, which attenuates high-frequency noise entering the interrupt signal generating unit 16*b*.

The capacitor 16*d* added to the threshold setting unit 16 is formed together with the resistor 16*a*, the interrupt signal generating unit 16*b*, and the diode 16*c*, and therefore has a capacitance in the order of picofarads (pF). On the other hand, the gate capacitance of the power semiconductor chip 14 is in the order of nanofarads (nF), which is about three orders of magnitude greater than the capacitance of the capacitor 16*d*. Therefore, when the control signal Vin takes a sudden drop, the capacitor 16*d* is charged rapidly with an electric charge stored in the gate capacitance of the power semiconductor chip 14, and thus the voltage signal Vs does not practically experience a decrease. Hence, the semiconductor device 10*a* of the second embodiment substantially operates in the same manner as the semiconductor device 10 of the first embodiment.

Figure 6:
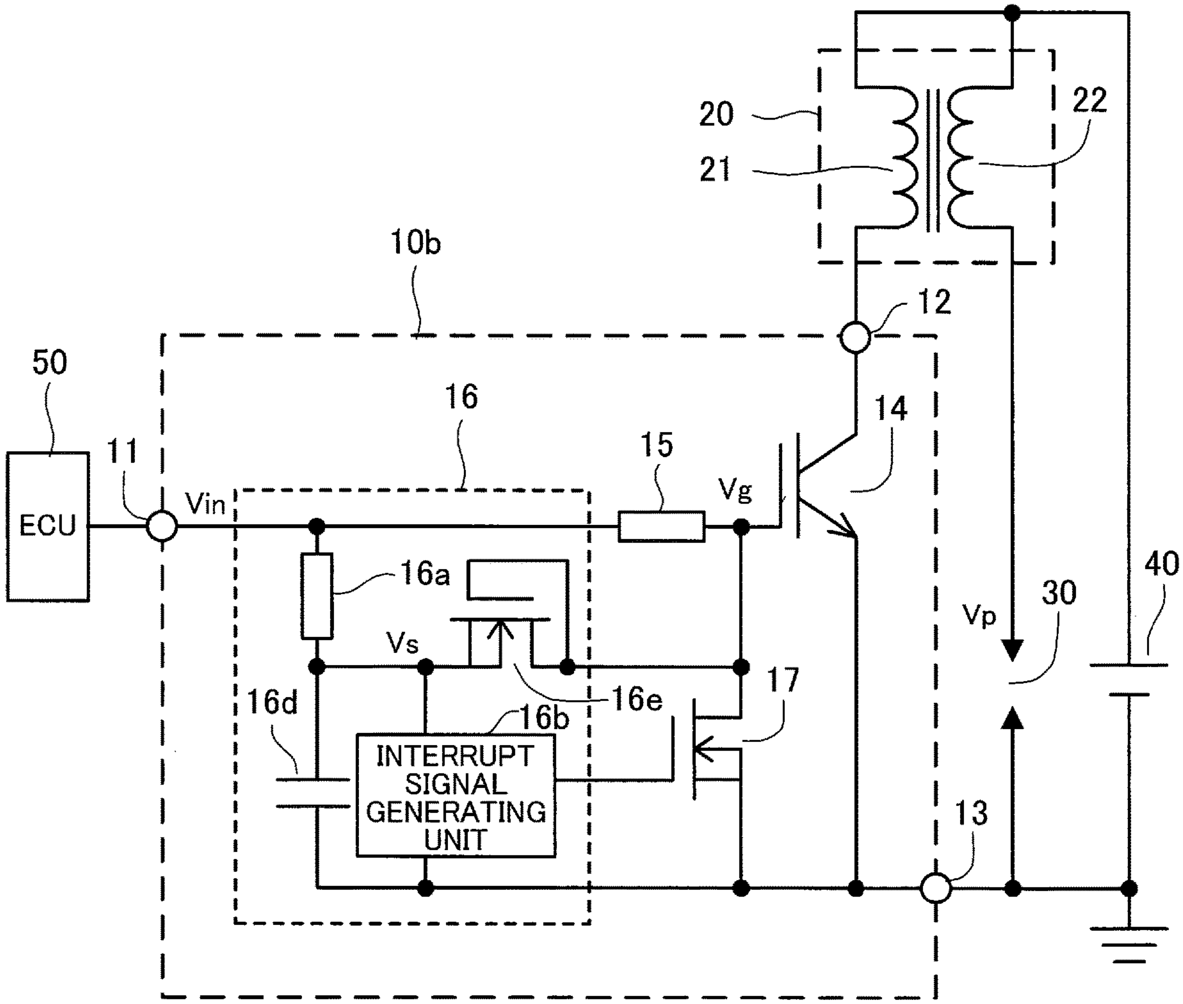
FIG. 6 is a circuit diagram illustrating a configuration example of an ignition system using a semiconductor device according to a third embodiment.

FIG. 6 is a circuit diagram illustrating a configuration example of an ignition system using a semiconductor device according to a third embodiment. In FIG. 6, the same reference numerals are given to the same or corresponding components as those illustrated in FIG. 5, and the detailed description thereof will be omitted.

According to a semiconductor device 10*b* of the third embodiment, the feed circuit for supplying an electric charge stored in the gate capacitance is realized by an n-channel MOSFET 16*e* in place of the diode 16*c* of the second embodiment. That is, the drain terminal of the MOSFET 16*e* is connected to the gate terminal of the power semiconductor chip 14, and the source terminal of the MOSFET 16*e* is connected to the supply terminal of the interrupt signal generating unit 16*b*. Then, the gate terminal of the MOSFET 16*e* is connected to its own drain terminal, to thereby form a diode.

According to the semiconductor device 10*b* also, when the control signal Vin takes a sudden drop, an electric charge stored in the gate capacitance of the power semiconductor chip 14 is supplied to the supply terminal of the interrupt signal generating unit 16*b* via the MOSFET 16*e* realizing a diode. Herewith, the voltage signal Vs at the supply terminal of the interrupt signal generating unit 16*b* does not experience a decrease even when the control signal Vin has taken a sudden drop, thereby preventing malfunction of the inverter 66 and, therefore, erroneous ignition of the spark plug 30.

In addition, the semiconductor device 10*b* may be configured without the capacitor 16*d* connected to the supply terminal and the earth terminal of the interrupt signal generating unit 16*b*, as in the case of the semiconductor device 10 of the first embodiment.

Figure 7:
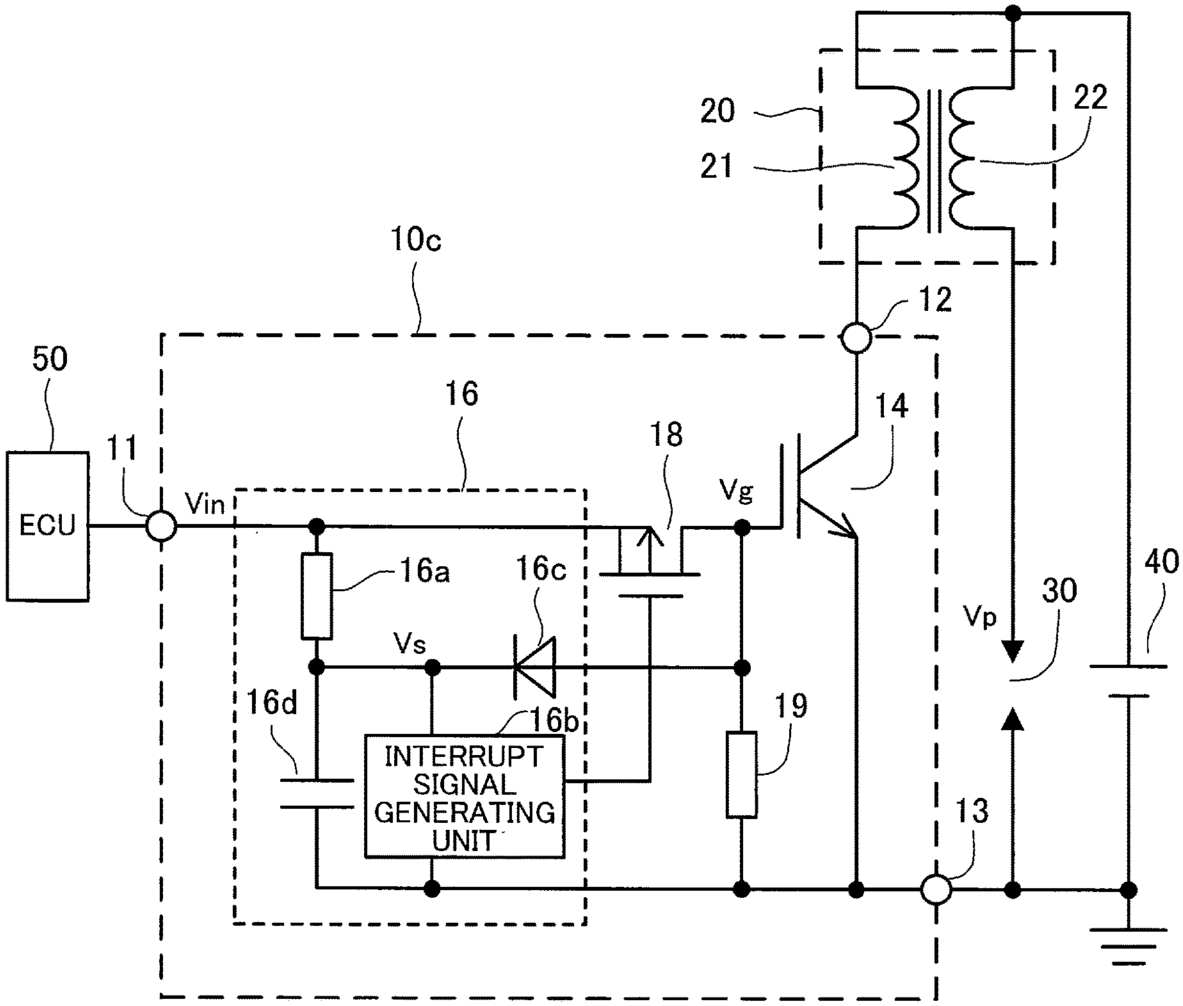
FIG. 7 is a circuit diagram illustrating a configuration example of an ignition system using a semiconductor device according to a fourth embodiment.
Figure 8:
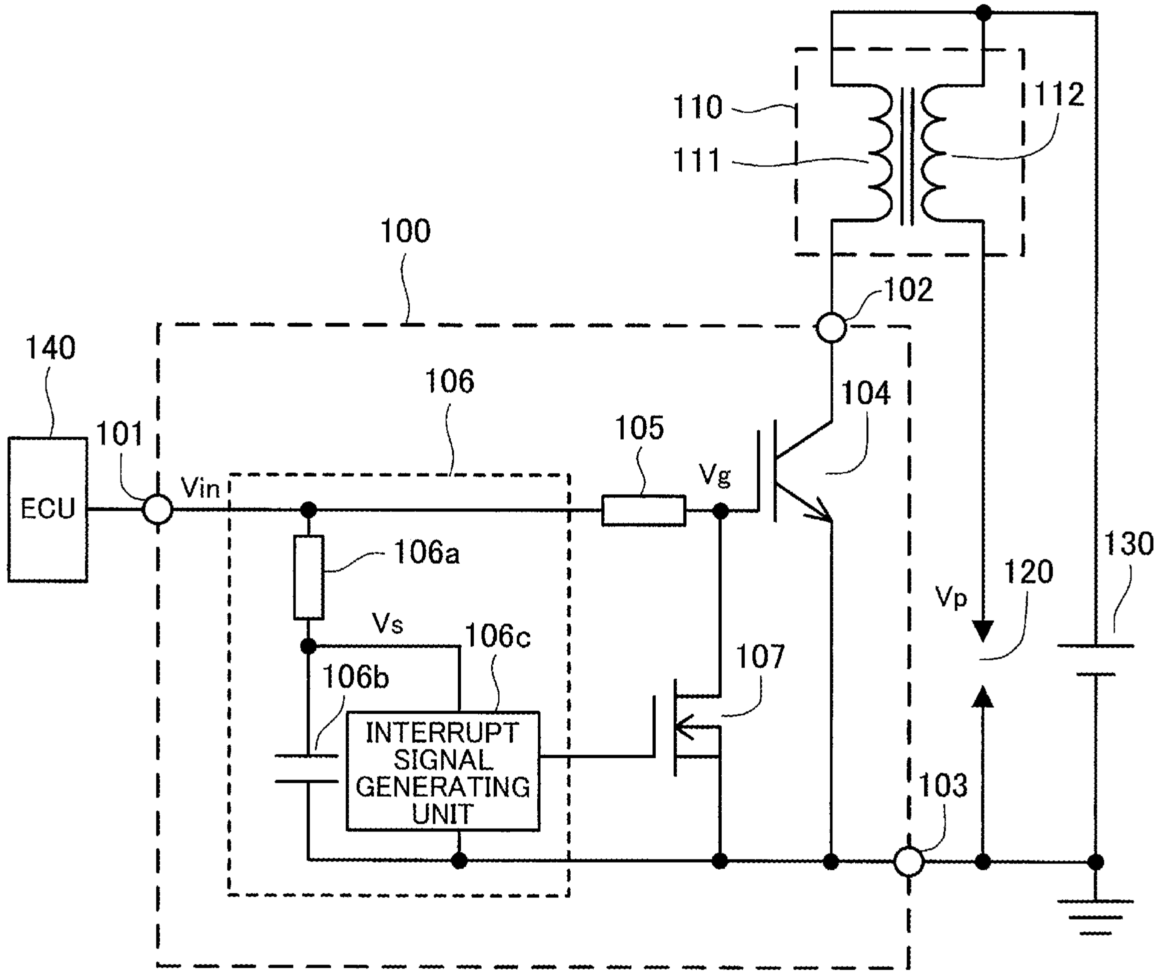
FIG. 8 is a circuit diagram illustrating a configuration example of an ignition system using a conventional semiconductor device.
Figure 9A:
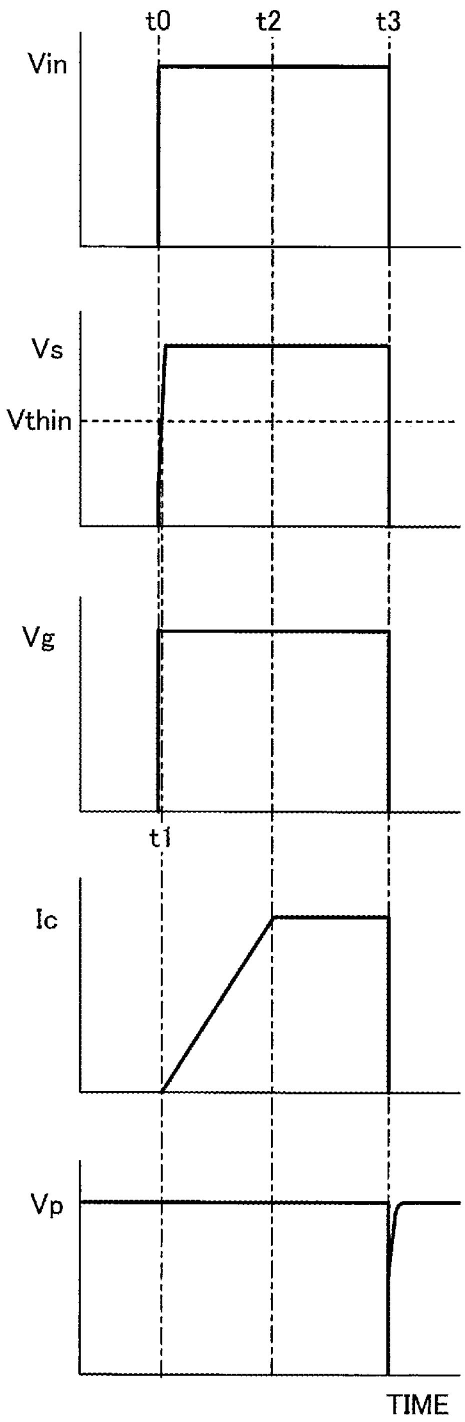
FIGS. 9A and 9B are timing diagrams, each illustrating an example of how the ignition system using the conventional semiconductor device operates, with FIG. 9A being associated with an example of normal operation and FIG. 9B being associated with an example of operation with the presence of noise.
Figure 9B:
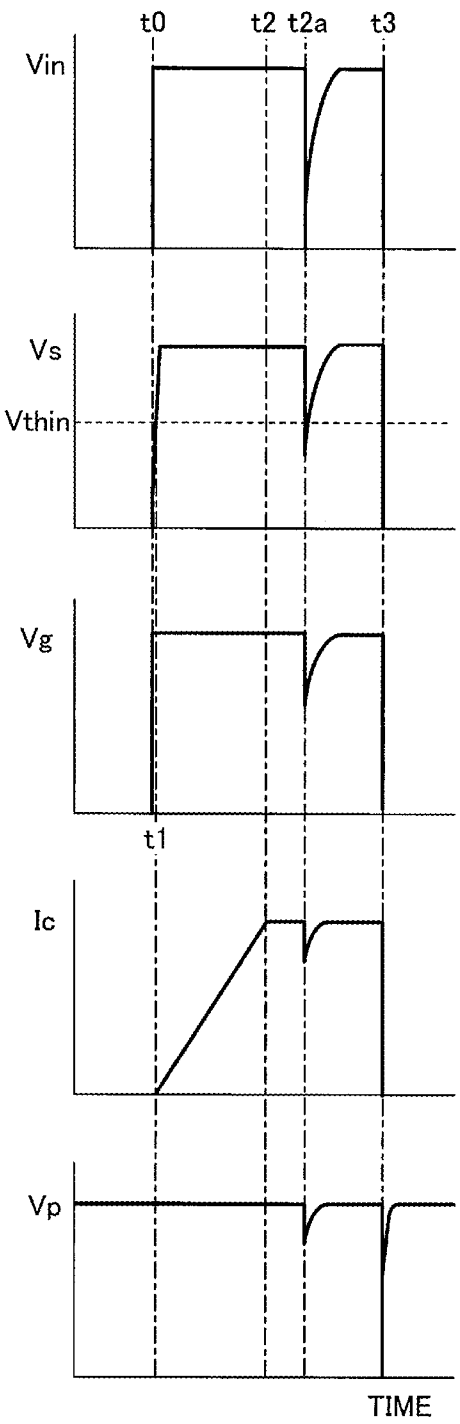

FIG. 7 is a circuit diagram illustrating a configuration example of an ignition system using a semiconductor device according to a fourth embodiment. In FIG. 7, the same reference numerals are given to the same or corresponding components as those illustrated in FIG. 5, and the detailed description thereof will be omitted.

According to a semiconductor device 10*c* of the fourth embodiment, a p-channel MOSFET 18 is connected between the gate terminal of the power semiconductor chip 14 and the input terminal 11 of the semiconductor device 10*c* and serves as a circuit for interrupting current flow to the power semiconductor chip 14. That is, as for the MOSFET 18, its drain terminal is connected to the gate terminal of the power semiconductor chip 14, its source terminal is connected to the input terminal 11 of the semiconductor device 10*c*, and its gate terminal is connected to the output terminal of the interrupt signal generating unit 16*b*. Herewith, when the control signal Vin for turning on the power semiconductor chip 14 is being input, the MOSFET 18 functions as a potential difference generating unit that produces a potential difference between the gate voltage Vg and the voltage of the control signal Vin. Therefore, the on-resistance of the MOSFET 18 is set to about 1 to 10 kΩ. In addition, upon receiving an interrupt signal from the interrupt signal generating unit 16*b*, the MOSFET 18 switches off to thereby turn off the power semiconductor chip 14. Thus, the MOSFET 18 assumes the function of the MOSFET 17 serving as a breaker circuit in the first to third embodiments.

In addition, according to the semiconductor device 10*c* of the fourth embodiment, a resistor 19 is connected between the gate terminal of the power semiconductor chip 14 and the earth terminal 13 of the semiconductor device 10*c*. The resistor 19 is provided to pull down the potential of the gate terminal of the power semiconductor chip 14 when the MOSFET 18 switches off upon receiving an interrupt signal from the interrupt signal generating unit 16*b*.

According to the semiconductor device 10*c* of the fourth embodiment, when the control signal Vin being OFF is input, the interrupt signal generating unit 16*b* and the MOSFET 18 switch off, and the voltage at the gate terminal of the power semiconductor chip 14 drops close to the ground potential due to the resistor 19.

When the interrupt signal generating unit 16*b* outputs a low-potential signal in response to an input of the control signal Vin being ON, the MOSFET switches on, which then turns on the power semiconductor chip 14.

If, while the control signal Vin at a high potential is being input, a negative surge voltage is induced and the control signal Vin takes a sudden drop, an electric charge stored in the gate capacitance of the power semiconductor chip 14 is supplied to the supply terminal of the interrupt signal generating unit 16*b* via the diode 16*c*. Herewith, even if the control signal Vin takes a sudden drop, the voltage signal Vs at the supply terminal of the interrupt signal generating unit 16*b* does not experience a decrease, thereby preventing malfunction of the inverter 66 and, therefore, erroneous ignition of the spark plug 30.

The semiconductor device 10*c* may be configured without the capacitor 16*d* connected to the supply terminal and the earth terminal of the interrupt signal generating unit 16*b*, as in the case of the semiconductor device 10 of the first embodiment. In addition, the diode 16*c* realizing a feed circuit may be implemented by a MOSFET, as in the case of the semiconductor device 10*b* of the third embodiment.

According to each of the semiconductor devices of the above-described embodiments, even if the voltage of the control signal takes a sudden drop while the control signal is exercising turn-on control of the power semiconductor chip, any reduction in the voltage of the operation power supply of the threshold setting unit, which is produced from the control signal, is compensated by an electric charge stored in the gate capacitance of the power semiconductor chip. In this manner, the individual semiconductor devices effectively prevent malfunction of the threshold setting unit.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device having an input terminal, an output terminal and an earth terminal, the semiconductor device comprising:

a power semiconductor element having a gate terminal, the power semiconductor element being connected between the output terminal and the earth terminal;

a gate resistor connected between the input terminal through which a control signal is input and the gate terminal of the power semiconductor element, the control signal input through the input terminal being applied through the gate resistor as a gate voltage to the gate terminal to turn on or off the power semiconductor element;

a threshold setting unit connected between the gate terminal of the power semiconductor element and the input terminal, being not connected to the output terminal, and including a feed circuit and an interrupt signal generating unit having a supply terminal to which the input terminal is connected, the interrupt signal generating unit being configured to use a voltage generated from the control signal input through the input terminal as an operation power supply, and to output an interrupt signal upon detecting that a voltage of the control signal is lower than a predetermined voltage; and a breaker circuit connected between the gate terminal of the power semiconductor element and the earth terminal, and being configured to be turned on upon receiving the interrupt signal to thereby turn off the power semiconductor element, wherein the feed circuit is directly connected to the gate terminal and the supply terminal, to supply an electric charge stored in gate capacitance of the power semiconductor element to the interrupt signal generating unit, responsive to a sudden drop of the voltage of the control signal, and the voltage generated from the control signal input through the input terminal is supplied to both the interrupt signal generating unit through the supply terminal, and the feed circuit.

2. The semiconductor device according to claim 1, wherein the breaker circuit is an n-channel metal-oxide-semiconductor field-effect transistor (MOSFET) having a drain terminal connected to the gate terminal of the power semiconductor element, a source terminal connected to the earth terminal, and a gate terminal connected to an output of the threshold setting unit.

3. The semiconductor device according to claim 1, wherein the power semiconductor element is an insulated gate bipolar transistor or a vertical metal-oxide-semiconductor field-effect transistor (MOSFET).

4. The semiconductor device according to claim 1, wherein the gate resistor is directly connected to the gate terminal of the power semiconductor element.

5. A semiconductor device, having an input terminal, an output terminal and an earth terminal, the semiconductor device comprising:

a power semiconductor element having a gate terminal, the power semiconductor element being connected between the output terminal and the earth terminal;

a gate resistor connected between the input terminal through which a control signal is input and the gate terminal of the power semiconductor element, the control signal input through the input terminal being applied through the gate resistor as a gate voltage to the gate terminal to turn on or off the power semiconductor element;

a threshold setting unit including a feed circuit and an interrupt signal generating unit having a supply terminal, the interrupt signal generating unit being configured to use a voltage generated from the control signal input through the input terminal as an operation power supply, and to output an interrupt signal upon detecting that a voltage of the control signal is lower than a predetermined voltage; and a breaker circuit connected between the gate terminal of the power semiconductor element and the earth terminal, and being configured to be turned on upon receiving the interrupt signal to thereby turn off the power semiconductor element, wherein the feed circuit is directly connected to the gate terminal and the supply terminal, to supply an electric charge stored in gate capacitance of the power semiconductor element to the interrupt signal generating unit, responsive to a sudden drop of the voltage of the control signal, and the threshold setting unit includes a resistor connected between the input terminal and the supply terminal, and being configured to generate a voltage signal as the operation power supply by reducing the voltage of the control signal, and the interrupt signal generating unit for monitoring the voltage signal and outputting the interrupt signal when the voltage of the control signal is lower than the predetermined voltage.

6. The semiconductor device according to claim 5, wherein the interrupt signal generating unit includes a voltage dividing circuit for dividing a voltage of the voltage signal, and an inverter that uses the voltage signal as a power supply and outputs a high potential when a voltage obtained by the dividing of the voltage dividing circuit is lower than a threshold of the inverter, and a low potential when the obtained voltage is higher than or equal to the threshold of the inverter.

7. The semiconductor device according to claim 5, wherein the feed circuit is a diode having an anode terminal directly connected to the gate terminal of the power semiconductor element and a cathode terminal connected to the supply terminal.

8. The semiconductor device according to claim 5, wherein the feed circuit is an n-channel metal-oxide-semiconductor field-effect transistor (MOSFET) having a drain terminal and a gate terminal both connected to the gate terminal of the power semiconductor element, and a source terminal connected to the supply terminal.

9. The semiconductor device according to claim 5, wherein the threshold setting unit further includes a capacitor connected to the earth terminal and a connection between the resistor and the interrupt signal generating unit.

10. A semiconductor device having an input terminal, an output terminal and an earth terminal, the semiconductor device comprising:

a power semiconductor element having a gate terminal, the power semiconductor element being connected between the output terminal and the earth terminal;

a gate resistor connected between the input terminal through which a control signal is input and the gate terminal of the power semiconductor element, the control signal input through the input terminal being applied through the gate resistor as a gate voltage to the gate terminal to turn on or off the power semiconductor element;

a threshold setting unit connected between the gate terminal of the power semiconductor element and the input terminal, and including an interrupt signal generating unit having a supply terminal that is not connected to the output terminal, and a feed circuit, the interrupt signal generating unit being configured to use a voltage generated from the control signal input through the input terminal as an operation power supply, and to output an interrupt signal upon detecting that a voltage of the control signal is lower than a predetermined voltage; and a breaker circuit connected between the gate terminal of the power semiconductor element and the earth terminal, and being configured to be turned on upon receiving the interrupt signal to thereby turn off the power semiconductor element, wherein the feed circuit is directly connected to the gate terminal and the supply terminal, to supply an electric charge stored in gate capacitance of the power semiconductor element to the interrupt signal generating unit, responsive to a sudden drop of the voltage of the control signal.

* * * * *